(12) United States Patent
Muchherla et al.

(10) Patent No.: US 11,527,291 B2
(45) Date of Patent: Dec. 13, 2022

(54) PERFORMING A PROGRAM OPERATION BASED ON A HIGH VOLTAGE PULSE TO SECURELY ERASE DATA

(71) Applicant: Micron Technology, Inc., Boise, ID (US)

(72) Inventors: Kishore Kumar Muchherla, Fremont, CA (US); Harish R. Singidi, Fremont, CA (US); Vamsi Pavan Rayaprolu, San Jose, CA (US); Ashutosh Malshe, Fremont, CA (US); Sampath K. Ratnam, Boise, ID (US)

(73) Assignee: MICRON TECHNOLOGY, INC, Boise, ID (US)

( * ) Notice: Subject to any disclaimer, the term of this patent is extended or adjusted under 35 U.S.C. 154(b) by 120 days.

(21) Appl. No.: 17/062,453

(22) Filed: Oct. 2, 2020

(65) Prior Publication Data
US 2021/0257028 A1    Aug. 19, 2021

Related U.S. Application Data

(60) Provisional application No. 62/977,126, filed on Feb. 14, 2020.

(51) Int. Cl.
*G11C 16/14*    (2006.01)
*G11C 16/26*    (2006.01)
(Continued)

(52) U.S. Cl.
CPC ............ *G11C 16/14* (2013.01); *G11C 16/08* (2013.01); *G11C 16/26* (2013.01); *G11C 16/30* (2013.01); *G11C 16/3404* (2013.01)

(58) Field of Classification Search
CPC ......... G11C 16/14; G11C 16/08; G11C 16/26; G11C 16/30; G11C 16/3404;
(Continued)

(56) References Cited

U.S. PATENT DOCUMENTS 6,091,640 A * 7/2000 Kawahara ............... G11C 16/10
                                                        365/185.28
6,134,148 A * 10/2000 Kawahara ........... G11C 11/5621
                                                        365/185.28
(Continued)

FOREIGN PATENT DOCUMENTS

JP    2020024774 A    2/2020
KR    20190046165 A   5/2019

OTHER PUBLICATIONS

PCT International Search Report and Written Opinion for International Application No. PCT/US2021/017992, dated Jun. 1, 2021, 9 pages.

*Primary Examiner* — Jay W. Radke
(74) *Attorney, Agent, or Firm* — Lowenstein Sandler LLP

(57) ABSTRACT

A request to perform a secure erase operation for a memory component can be received. A voltage level that is applied to unselected wordlines of the memory component during a read operation can be determined. A voltage pulse can be applied to at least one wordline of the memory component to perform the secure erase operation. The voltage pulse can be associated with a program operation to place a memory cell of the memory component at another voltage level that exceeds the voltage level that is applied to the unselected wordlines of the memory component during the read operation.

20 Claims, 7 Drawing Sheets

(51) Int. Cl.
*G11C 16/34* (2006.01)
*G11C 16/30* (2006.01)
*G11C 16/08* (2006.01)

(58) Field of Classification Search
CPC ............ G11C 11/5628; G11C 11/5635; G11C 11/5642; G11C 16/16; G11C 16/22
See application file for complete search history.

(56) References Cited

U.S. PATENT DOCUMENTS

| | | | | |
|---|---|---|---|---|
| 6,172,912 | B1* | 1/2001 | Hirano | G11C 11/5621 365/185.28 |
| 6,396,742 | B1* | 5/2002 | Korsh | G11C 29/50 365/185.29 |
| 6,888,758 | B1* | 5/2005 | Hemink | G11C 16/10 365/185.18 |
| 7,280,403 | B2* | 10/2007 | Kessenich | G11C 8/08 365/185.18 |
| 7,746,704 | B1* | 6/2010 | Tang | G11C 16/10 365/185.28 |
| 7,852,680 | B2* | 12/2010 | Kuo | G11C 16/0466 365/185.24 |
| 2005/0226055 | A1* | 10/2005 | Guterman | G11C 16/12 365/185.28 |
| 2009/0185428 | A1* | 7/2009 | Kuo | G11C 11/5628 365/185.18 |
| 2011/0080792 | A1* | 4/2011 | Nazarian | G11C 16/0416 365/195 |
| 2016/0328152 | A1 | 11/2016 | Nemazie | |
| 2019/0267106 | A1 | 8/2019 | Date et al. | |
| 2020/0020403 | A1 | 1/2020 | Lee et al. | |
| 2020/0090769 | A1* | 3/2020 | Maeda | G11C 5/147 |

\* cited by examiner

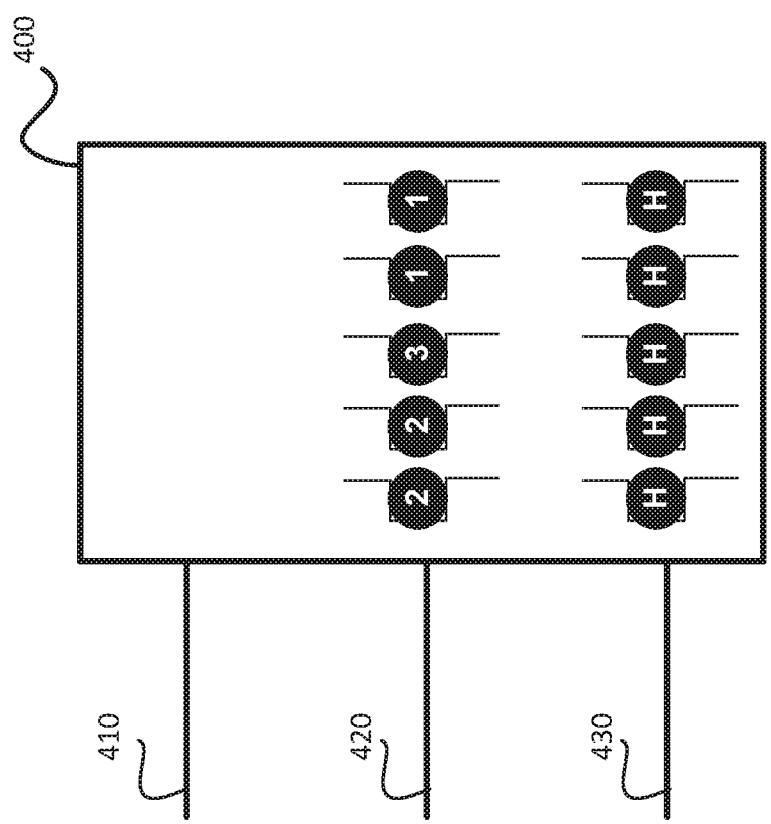

PERFORMING A PROGRAM OPERATION BASED ON A HIGH VOLTAGE PULSE TO SECURELY ERASE DATA

RELATED APPLICATIONS

This application claims the benefit of priority from U.S. Provisional Application No. 62/977,126, filed on Feb. 14, 2020, which is herein incorporated by reference.

TECHNICAL FIELD

The present disclosure generally relates to a memory sub-system, and more specifically, relates to performing a program operation based on a high voltage pulse to securely erase data in a memory sub-system.

BACKGROUND

A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various implementations of the disclosure.

FIG. 4B illustrates memory cells of the block in response to a read operation after the application of the high voltage pulse to a wordline of the block in accordance with some embodiments of the present disclosure.

DETAILED DESCRIPTION

Figure 1:
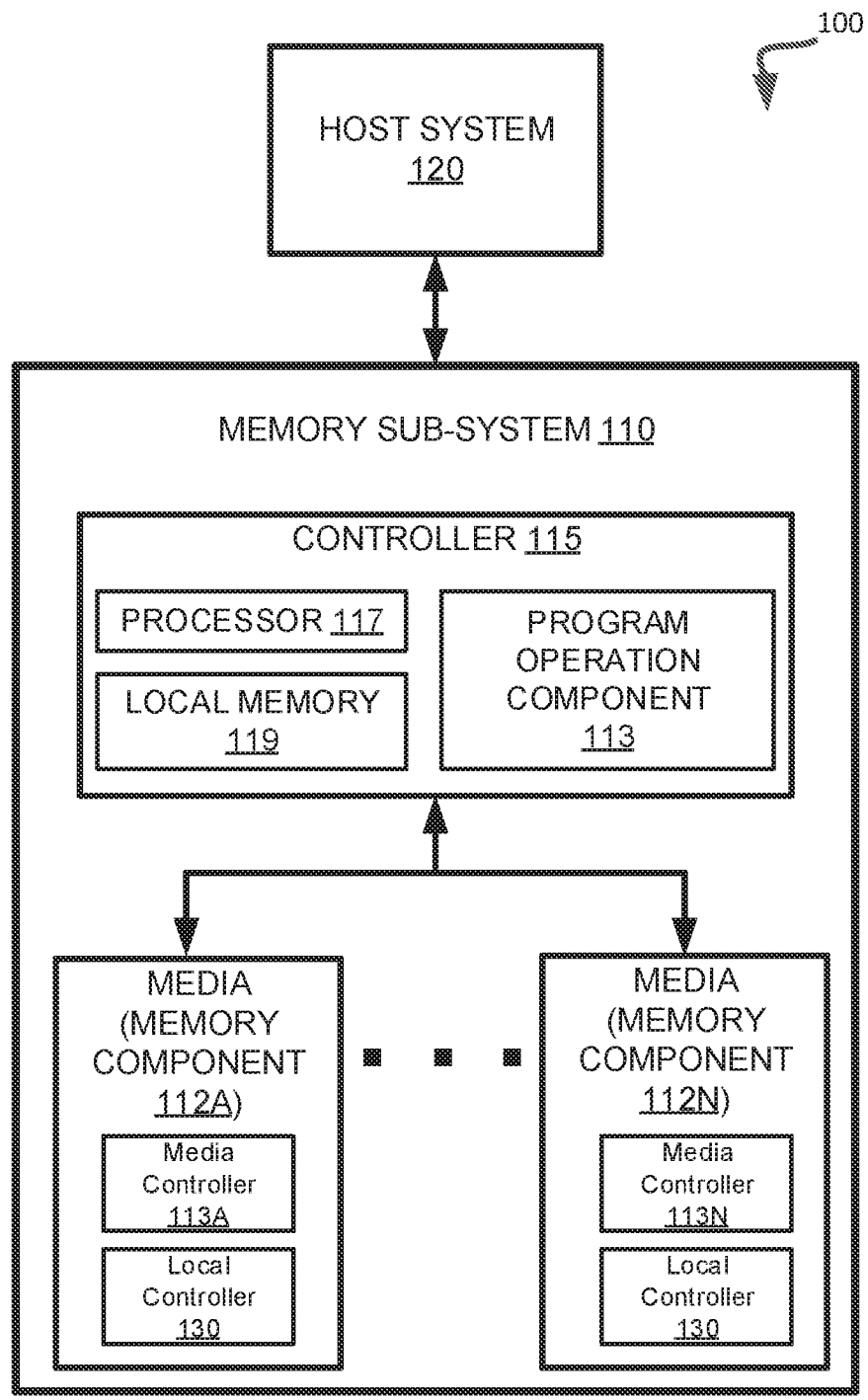
FIG. 1 illustrates an example computing environment that includes a memory sub-system in accordance with some embodiments of the present disclosure.

Aspects of the present disclosure are directed to performing a program operation based on a high voltage pulse to securely erase data in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory devices that store data. The host system can provide data to be stored at the memory sub-system and can request data to be retrieved from the memory sub-system. A memory device can be a non-volatile memory device. A non-volatile memory device is a package of one or more die. Each die can comprise one or more planes. For some types of non-volatile memory devices (e.g., NAND devices), each plane comprises a set of physical blocks. For some memory devices, blocks are the smallest area than can be erased. Each block comprises a set of pages. Each page comprises a set of memory cells, which store bits of data.

A conventional memory sub-system performs an erase operation to remove the data stored at the memory devices included in the memory sub-system. For example, in order to perform the erase operation, the conventional memory sub-system can erase or otherwise corrupt the data stored at each block that stores data at each of the memory devices. However, performing such an erase operation for each block of every device included in the memory sub-system can utilize a large amount of time.

Aspects of the present disclosure address the above and other deficiencies by performing a program operation based on a high voltage pulse to securely erase data in a memory sub-system. For example, a secure erase operation can be received to corrupt or otherwise make data inaccessible or irretrievable from the memory sub-system. To perform the secure erase operation, the high voltage pulse can be applied to a single wordline of each block that stores data from the host system. A block can include multiple wordlines where each wordline is a series of memory cells. During a read operation, data from a single wordline of a block can be retrieved by applying a read voltage signal to the wordline from which data is to be retrieved while applying a pass voltage signal to the remaining or unselected wordlines of the block from which data is not to be retrieved. The applying of the pass voltage signal can result in the memory cells of the unselected wordlines to be in a conductive state while the read voltage signal that is applied to the selected wordline can result in memory cells being at either a conductive state (i.e., a short state) or a resistive state (i.e., an open state) based on a threshold voltage state that represents a bit value that is stored at each memory cell of the selected wordline. For example, if the applied read voltage signal exceeds the threshold voltage state of a memory cell, then the memory cell can be in the short state and can be interpreted as a first value (e.g., '1'). Otherwise, if the applied read voltage signal does not exceed the threshold voltage state of the memory cell, then the memory cell can be in the open state and can be interpreted as a different or second value (e.g., '0').

As previously described, the program operation can be based on a high voltage pulse to securely erase data. The high voltage pulse can be applied to at least one wordline of a block so that the read operation of the block can return a single value (e.g., 0 or multiple 0 bits) as a result of each memory cell of the wordline being in the open state. For example, the magnitude of program pulse voltage to securely erase data can be set such that the programmed (erased) memory cells will have threshold voltages higher than the voltage applied to unselected wordlines when the memory sub-system is performing a read operation of a block. Thus, each memory cell of a particular wordline in a block can be at a high voltage state that exceeds each of the read threshold voltage states and/or the pass voltage state (e.g., the voltage levels of any of the read threshold voltage states or pass voltage state). Thus, if a subsequent read operation is performed at the block, the wordline can influence the read operation of a selected wordline so that the read operation returns the same value for each memory cell (e.g., a '0') of the wordline that is intended to be read. For example, the pass voltage signal can be applied to a particular unselected wordline and since each memory cell of the particular wordline is at a high threshold voltage level or state as a result of the high voltage pulse, the values returned can be all at a '0' value regardless of the actual values stored at the selected wordline that is intended to be read.

Advantages of the present disclosure include, but are not limited to, a decrease in the amount of time and energy that is utilized to perform an erase operation of the memory sub-system. For example, since a high voltage pulse can be applied to each memory cell of a single wordline of a block as opposed to performing an erase or other such operation on each memory cell of each wordline of the block, the secure erase operation can be completed in less time. As a result, the performance of the memory sub-system can be improved as the memory sub-system can be used to perform an increased number of other memory operations as less time is needed to perform the secure erase operation.

FIG. 1 illustrates an example computing environment 100 that includes a memory sub-system 110 in accordance with some embodiments of the present disclosure. The memory sub-system 110 can include media, such as memory components 112A to 112N (also hereinafter referred to as "memory devices"). The memory components 112A to 112N can be volatile memory components, non-volatile memory components, or a combination of such. A memory sub-system 110 can be a storage device, a memory module, or a hybrid of a storage device and memory module. Examples of a storage device include a solid-state drive (SSD), a flash array, a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to a memory system. The memory system can include one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, embedded computer (e.g., one included in a vehicle, industrial equipment, or a networked commercial device), or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs), multi-level cells (MLCs), triple level cells (TLCs), or quad-level cells (QLCs). In some embodiments, a particular memory component can include both an SLC portion and a MLC portion of memory cells. Each of the memory cells can store one or more bits of data used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical address (e.g., logical block address (LBA)) and a physical address (e.g., physical block address) that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N. Any one of the memory components 112A to 112N can include a media controller (e.g., media controller 113A and media controller 113N) to manage the memory cells of the memory component 112, to communicate with the memory sub-system controller 115, and to execute memory requests (e.g., read or write) received from the memory sub-system controller 115.

The memory sub-system 110 includes a program operation component 113 that can be used to perform an erase operation for the memory sub-system 110. In some embodiments, the controller 115 includes at least a portion of the wear leveling component 113. For example, the controller 115 can include a processor 117 (processing device) configured to execute instructions stored in local memory 119 for performing the operations described herein. In some embodiments, the program operation component 113 is part of the host system 120, an application, or an operating system.

The program operation component 113 can be used to apply a high voltage pulse during a program operation to a wordline in response to receiving a request to perform a secure erase operation. The secure erase operation can correspond to corrupting or otherwise make irretrievable the data stored at one or more blocks. The program operation component 113 can determine a pass voltage level that is to be applied to unselected wordlines when a read operation is to be performed. The program operation component 113 can apply a voltage pulse to a wordline in a block where the applied voltage pulse will program all of the memory cells to a higher voltage level than the pass voltage level used in a read operation. In some embodiments, the program operation component 113 can apply the voltage pulse to a single wordline for each block of the memory sub-system that is to be securely erased in response to receiving the secure erase operation. As such, the program operation component 113 can securely destroy data stored at the memory sub-system in response to receiving a secure erase operation from the host system. In some embodiments, the program operation component 113 can perform a program operation on unselected wordlines and/or bitlines or any other type of program operation to increase the threshold voltage at a memory cell beyond a target voltage level above pass voltage used in a read operation so as to effectively destroy or make inaccessible the data stored at the memory component. Further details with regards to the operations of the program operation component 113 are described below.

In some embodiments, the memory components 112A to 112N can be managed memory devices (e.g., managed NAND), which is a raw memory device combined with a local controller 130 for memory management within the same memory device package. A local controller 130 can include a program operation component 113.

Figure 2:
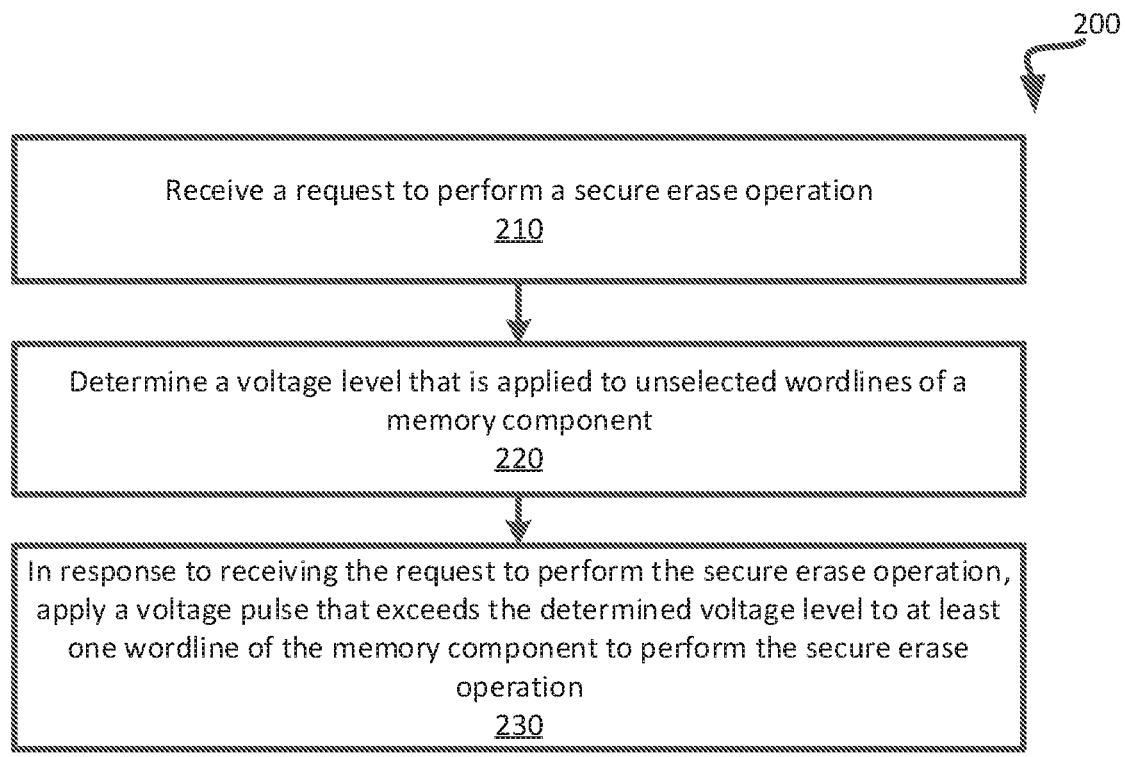
FIG. 2 is a flow diagram of an example method to perform a program operation based on a high voltage pulse in accordance with some embodiments.

FIG. 2 is a flow diagram of an example method 200 to perform an erase operation based on a high voltage pulse in accordance with some embodiments. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the program operation component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 2, at operation 210, the processing logic receives a request to perform a secure erase operation. For example, the secure erase operation can indicate that data stored at one or more memory components of a memory sub-system is to no longer be retrievable or accessible. In some embodiments, the secure erase operation can indicate that the data stored at the memory sub-system is to be corrupted or is to be otherwise effectively erased. The request can be received from a host system that is utilizing the memory sub-system to store data. At operation 220, the processing logic determines a voltage level that is applied to unselected wordlines of the memory component for a read operation. The voltage level can be the voltage that is applied to unselected wordlines of a block while one or more read threshold voltages are applied to a selected wordline of the block during a read operation of a memory component that includes the block. The voltage level that is applied to the unselected wordlines can be referred to as a pass voltage level. In some embodiments, the pass voltage level can be at a higher voltage than any of the read threshold voltages. In the same or alternative embodiments, a data structure accessible by a controller of the memory sub-system can store the voltage information of the pass voltage level.

At operation 230, the processing logic applies a voltage pulse to at least one wordline of the memory component to perform the secure erase operation in response to receiving the request to perform the secure erase operation where the voltage pulse is at another voltage level that exceeds the voltage level that is applied to the unselected wordlines of the memory component during the read operation. The secure erase operation can be used to destroy data stored at the memory sub-system by applying the voltage pulse during a program operation so that any subsequent read operation cannot recover or retrieve the data stored at the memory sub-system. In some embodiments, the voltage pulse can be used to store a threshold voltage level at each memory cell of a particular wordline where the threshold voltage level of each of the memory cells exceeds the pass voltage level that is applied to unselected wordlines for a read operation. Thus, an increased voltage can be applied to the wordline where the increased voltage exceeds a prior pass voltage that is used to not select the wordline during a read operation. The increased voltage that is applied to the wordline can result in each memory cell of the wordline to be at a voltage state that exceeds the pass voltage level. In some embodiments, the applied voltage pulse can be used to alter the voltage biases on unselected wordlines or bitlines so as to effectively destroy or make inaccessible the data stored at the memory component.

Figure 3:
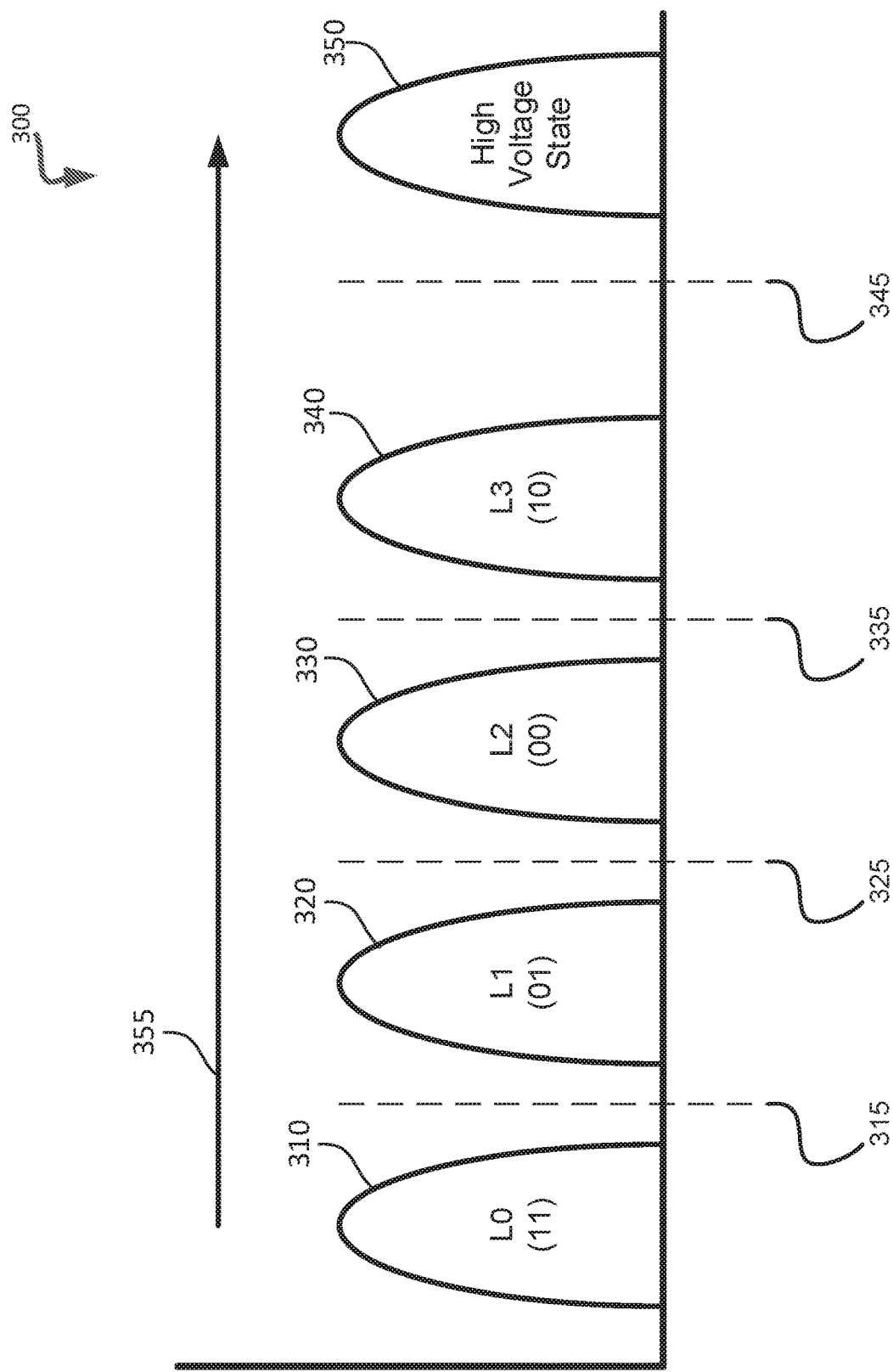
FIG. 3 illustrates the application of a high voltage pulse to memory cells in accordance with some embodiments of the present disclosure.

FIG. 3 illustrates the application of a high voltage pulse to memory cells in accordance with some embodiments of the present disclosure. The application of the high voltage pulse can be performed by the program operation component 113 of FIG. 1.

As shown in FIG. 3, a memory cell can store multiple threshold voltage states where each state represents a logical bit value. For example, a first voltage state 310 can represent the value '11,' the second voltage state 320 can represent the value '01', the third voltage state 330 can represent the value '00,' and the fourth voltage state 340 can represent the value '10.' As such, the first through fourth voltage states can represent programmed states of memory cells that can be successfully read via a read operation. Although four voltage states representing a combination of two bits are illustrated, any number of voltage states to represent various combinations of bits can be stored at a memory cell. For example, the memory cell of FIG. 3 can be a multi-level cell (MLC), a triple-level cell (TLC), or a quad-level cell (QLC).

In operation, the applying of a read threshold voltage 315 can result in the memory cell with the first voltage state 310 to conduct (i.e., be in the short state) while memory cells with the other voltage states 320, 330, and 340 do not conduct (i.e. will be in the open state). The applying of the read threshold voltage 325 can result in the memory cells with the first voltage state 310 and the second voltage state 320 to conduct while the other memory cells with voltage states 330 and 340 will not conduct when the read threshold voltage 325 is applied to the wordline that includes the memory cell. Similarly, the application of the read threshold voltages 335 and 345 can cause memory cells at voltage states that are less than the applied read threshold voltage to conduct while memory cells at voltage states that are higher than the applied read threshold voltage will not conduct.

The pass voltage state 345 can represent the voltage level that is applied to unselected wordlines. Since the pass voltage state 345 is higher than the voltage states that can represent the bit values of the memory cell, the application of the pass voltage state 345 can result in each memory cell of the unselected wordline to conduct and be in the short state. The high voltage state 350 can be the voltage state of the memory cell after the high voltage pulse 355 has been applied to a wordline that includes the memory cell. For example, the high voltage state 350 can be at an increased voltage level that exceeds the pass voltage state 345. The application of the high voltage pulse 355 to the wordline can result in memory cells of the wordline that were at the voltage states 310, 320, 330, and 340 to be at the high voltage state 350. Thus, if a pass voltage of the pass voltage state 345 is applied to memory cells of an unselected wordline with memory cells in order to perform a read operation of another selected wordline, each memory cell of the unselected wordline will not conduct and will be in the open state since the high voltage state 350 is higher than the pass voltage state 345. As such, the high voltage state 350 can represent the memory cells that have been subjected to the high voltage pulse of the secure erase operation to destroy data stored at the memory sub-system.

Figure 4A:
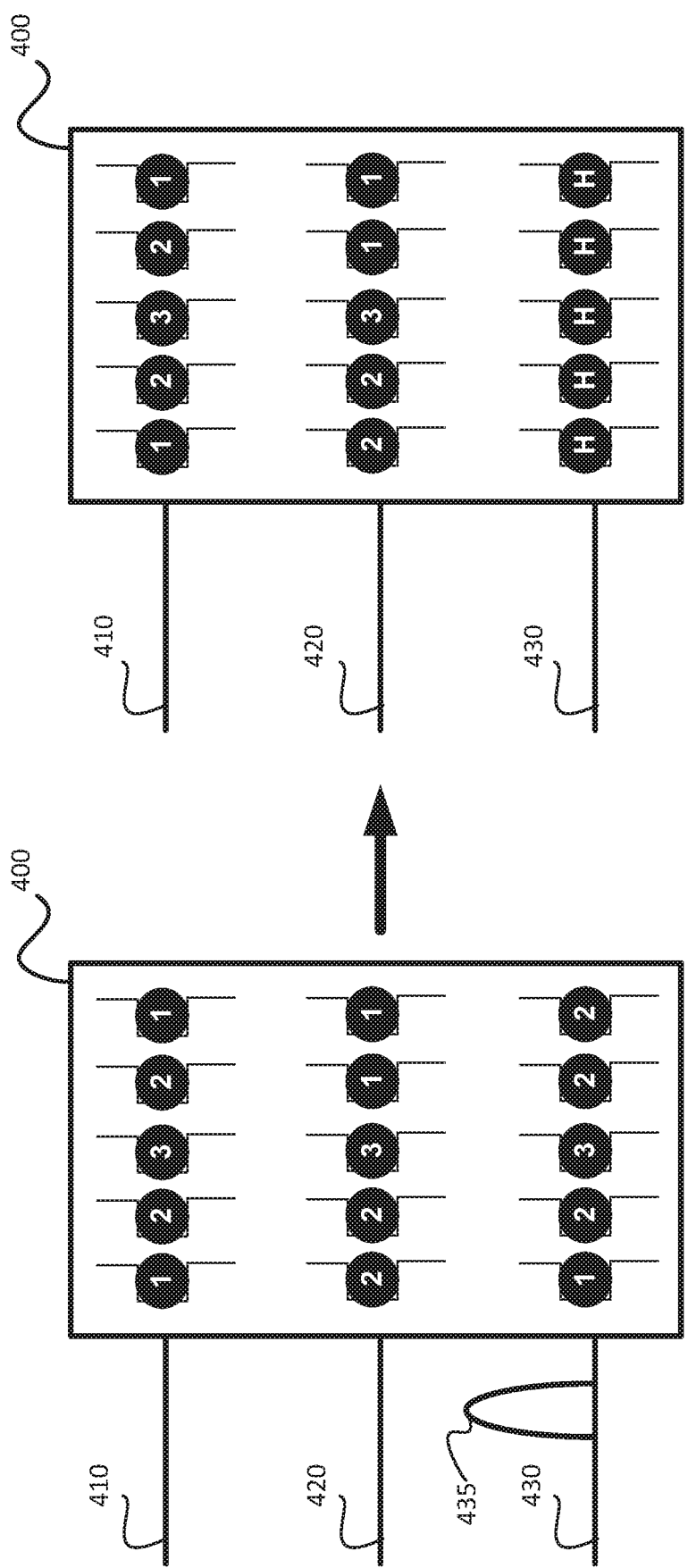
FIG. 4A illustrates wordlines of a block in response to the application of a high voltage pulse to a word line of the block in accordance with some embodiments of the present disclosure.

FIG. 4A illustrates wordlines of a block 400 in response to the application of a high voltage pulse to a word line of the block in accordance with some embodiments of the present disclosure. The block 400 can be corrupted to an unrecoverable data state (i.e., securely erased) by applying a high voltage pulse to one of the wordlines of the block 400. In some embodiments, the applying of the high voltage pulse can be performed by the program operation component 113.

As shown, the block 400 can include multiple wordlines of memory cells. For example, the block 400 can include a first wordline 410, a second wordline 420, and a third wordline 430. The distribution of threshold voltages at each memory cell across the wordlines 410, 420, and 430 is also shown. For example, the first wordline 410 and the second wordline 420 include memory cells with voltage states representing logical levels 1 through 3 as previously described with respect to FIG. 3. As previously described, a high voltage pulse can be applied to one of the wordlines of a block. For example, the high voltage pulse can be applied to the third wordline 430 so that each memory cell of the third wordline is forced to the high voltage state. In some embodiments, the memory cells of the third wordline 430 can be at various voltage states similar to wordlines 410 and 420 (e.g., at voltage states representing different logical levels). After the applying of the high voltage pulse, the memory cells of the third wordline 430 can each change to the high voltage state.

FIG. 4B illustrates memory cells of the block 400 in response to a read operation after the application of the high voltage pulse to a wordline of the block in accordance with some embodiments of the present disclosure. In some embodiments, the high voltage pulses can be applied by the program operation component 113.

As shown, a read operation can be performed to retrieve the values stored at memory cells across the second wordline 420. During the read operation, the pass voltage can be applied to the first wordline 410 and the third wordline 430 while a read threshold voltage can be applied to the second wordline 420. As a result of the pass voltage being applied to the first wordline 410, each memory cell of the first wordline 410 can be conducting and thus be in the short state since the pass voltage exceeds any threshold voltage programmed to each of the memory cells of the first wordline 410. The applying of a particular read threshold voltage state can result in different memory cells of the second wordline 420 to conduct or to not conduct. For example, if a read threshold voltage that is at a level between the logical levels 1 and 2 is applied (e.g., the second read threshold voltage), then memory cells with a threshold voltage representing logical levels 0 and 1 can conduct while memory cells with a threshold voltage representing logical levels 2 and 3 will not conduct. The memory cells that do not conduct can be interpreted as a 0 value while the memory cells that do conduct can be interpreted as a bit value corresponding to the logical level that is represented by the threshold voltage. However, since the memory cells of the third wordline 430 are at the high voltage state that exceeds the pass voltage state that is applied to the third wordline 430, each memory cell of the third wordline will not conduct.

In operation, the read operation will return a zero value for each memory cell of the read wordline 420 since the memory cells of the third wordline 430 are not conducting and are in the open state. Thus, the read operation results in all zero values despite any values that are represented by the memory cells of the second wordline 420.

Figure 5:
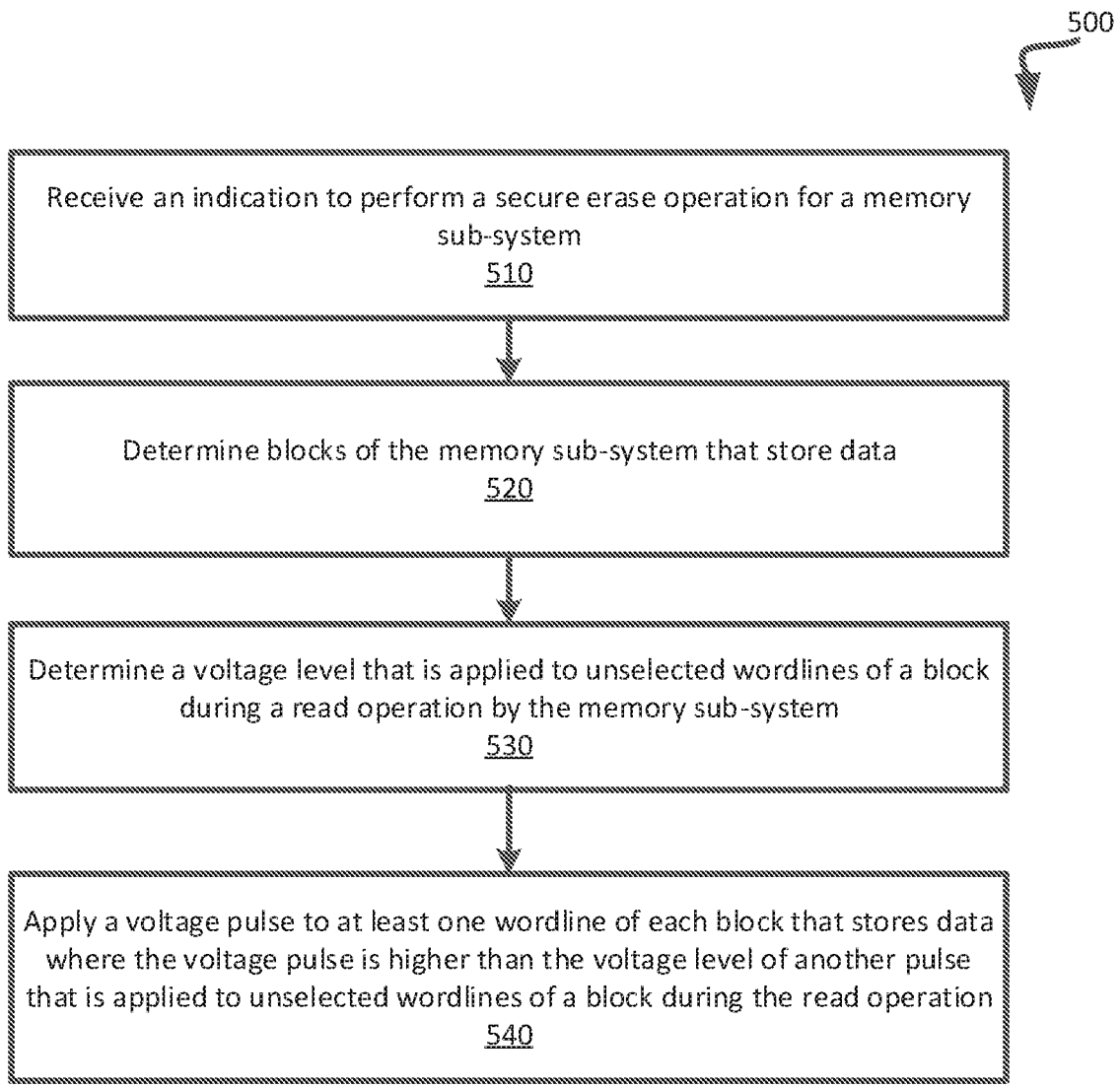
FIG. 5 is a flow diagram of an example method to apply a high voltage pulse to a wordline in each block of a memory component in accordance with some embodiments.

FIG. 5 is a flow diagram of an example method 500 to apply a high voltage pulse to a wordline in each block of a memory component in accordance with some embodiments. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the program operation component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 5, at operation 510, the processing logic receives an indication to perform a secure erase operation for a memory sub-system. For example, a request can be received from a host system. The request can indicate that the data from the host system that is stored at the memory sub-system is to be no longer accessible or retrievable. In some embodiments, the indication can identify particular host data that is to be securely erased. For example, the host system can identify certain data files or other such data structures that are to be securely erased. At operation 520, the processing logic determines blocks of the memory sub-system that store data. For example a data structure of the memory sub-system can include information that identifies portions or blocks of memory components that store data from the host system. In some embodiments, the memory sub-system can identify particular blocks that store the data identified in the indication from multiple other blocks presently used to store additional data from the host system.

At operation 530, the processing logic determines a voltage level that is applied to unselected wordlines of a block during a read operation by the memory sub-system. For example, the pass voltage level that is applied to unselected wordlines during the read operation of a block can be identified. Furthermore, at operation 540, the processing logic applies a voltage pulse to at least one wordline of each block that stores data where the voltage pulse is at another level that is higher than the voltage level of another voltage pulse (i.e., the pass voltage) that is applied to the unselected wordlines during the read operation. As such, the voltage pulse that is applied to the wordline places the memory cells at a voltage level that is higher than the voltage applied during a read operation. For example, a high voltage pulse can be provided to a single wordline of each block so that memory cells of a respective wordline are at a high voltage state that exceeds the pass voltage level. The application of the voltage pulse can be in response to the indication to perform the erase operation for the memory sub-system. As an example, if the pass voltage level that is applied to unselected wordlines is 7V, then the voltage pulse that is applied to the wordline can program the wordline to a voltage that is above 7V.

In some embodiments, a data structure of the memory sub-system can store the wordline of each block for which the high voltage pulse has been applied. When a subsequent secure erase operation is to be performed, the memory sub-system can retrieve the data structure and apply the high voltage pulse to a different wordline that did not receive the high voltage pulse. Thus, the high voltage pulse can be applied to different wordlines for each subsequent secure erase operation. The switching between wordlines to be applied the high voltage pulse can result in the prevention of the high voltage pulse repeatedly being applied to a single wordline for multiple consecutive secure erase operations that can possibly degrade or damage the memory cells of the wordline.

In the same or alternative embodiments, the high voltage pulse can be applied to a number of wordlines of a block based on a characteristic of the data stored at the block. For example, certain private data can be stored at a block and the secure erase operation can result in the high voltage pulse being applied to two or more wordlines of a block that includes the private data. Otherwise, if the block stores public data or other data that is not considered secret, then the high voltage pulse can be applied to a single wordline of the block.

Figure 6:
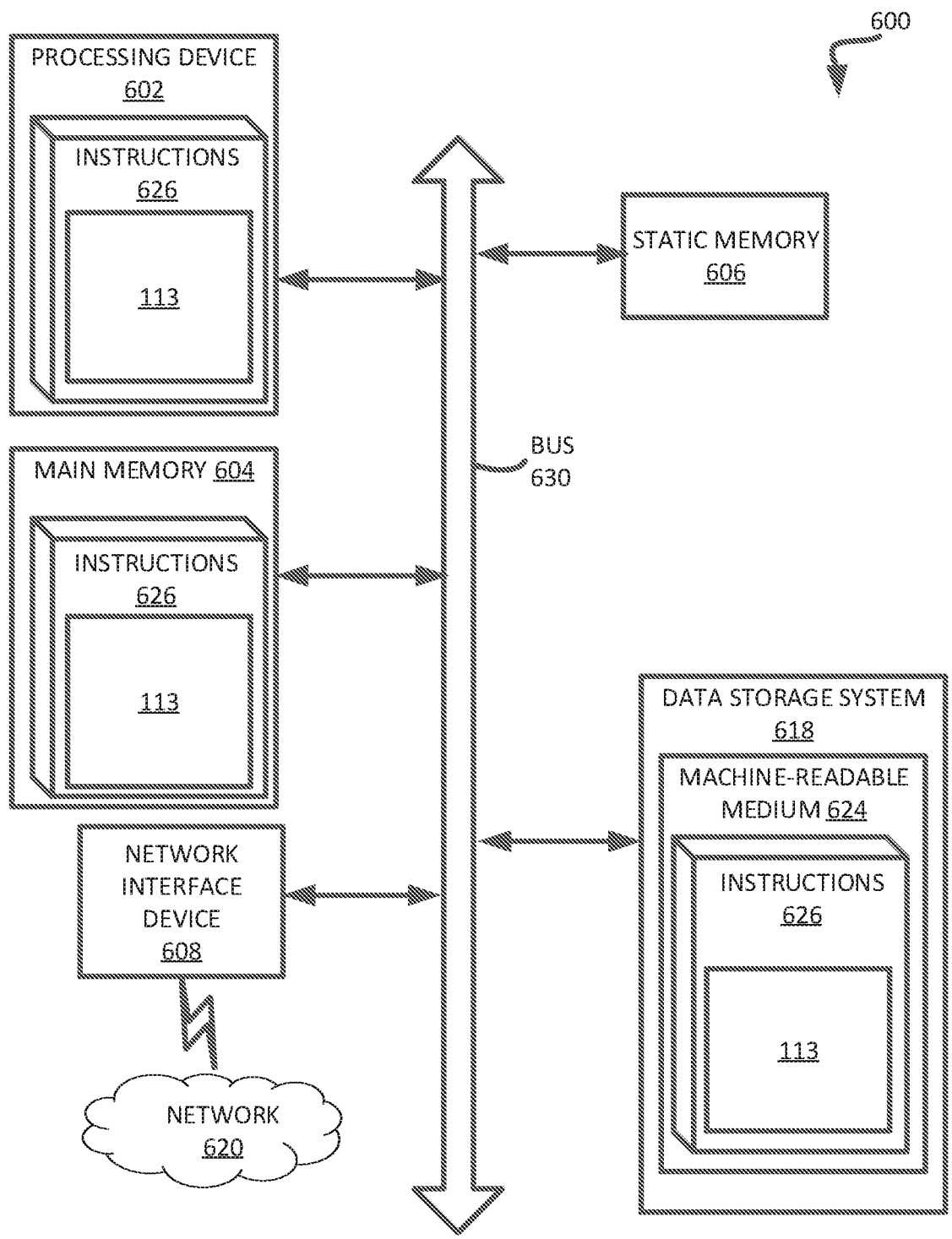
FIG. 6 is a block diagram of an example computer system in which implementations of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to a program operation component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, digital or non-digital circuitry, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a program operation component (e.g., the program operation component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
   receiving a request to perform a secure erase operation for a memory component;
   determining a voltage level applied to unselected wordlines of a block of the memory component during a read operation of the block; and
   applying, by a processing device, a voltage pulse to at least one wordline of the memory component to perform the secure erase operation, the voltage pulse being applied in a program operation to increase a threshold voltage of a memory cell of the memory component to another voltage level that exceeds each threshold voltage state of the memory cell, wherein each threshold voltage state represents a bit value stored at the memory cell.

2. The method of claim 1, wherein each memory cell of the at least one wordline is in an open state in response to the application of the voltage pulse to the at least one wordline during a subsequent read operation.

3. The method of claim 2, wherein the subsequent read operation is to retrieve data associated with a particular wordline of the memory component, and wherein a result of the subsequent read operation corresponds to a same value that is based on each memory cell of the at least one wordline being in the open state during the subsequent read operation.

4. The method of claim 1, wherein each memory cell of the at least one wordline is at a threshold voltage state that exceeds the determined voltage level in response to the application of the voltage pulse during the program operation.

5. The method of claim 1, further comprising:
   determining whether the voltage pulse has been applied to a particular wordline of the memory component in response to a prior secure erase operation; and
   in response to determining that the voltage pulse has not been applied to the particular wordline, selecting the particular wordline as the at least one wordline to which the voltage pulse is to be applied.

6. The method of claim 1, further comprising:
   determining whether the voltage pulse has been applied to a particular wordline of the memory component in response to a prior secure erase operation; and
   in response to determining that the voltage pulse has been applied to the particular wordline, selecting a different wordline as the at least one wordline to which the voltage pulse is to be applied.

7. The method of claim 1, wherein the at least one wordline corresponds to one or more wordlines in each block of the memory component that is to be securely erased.

8. A system comprising:
   a memory component; and
   a processing device, operatively coupled with the memory component, to:
   receive a request to perform a secure erase operation for a memory component;
   determine a voltage level applied to unselected wordlines of a block of the memory component during a read operation of the block; and
   apply a voltage pulse to at least one wordline of the memory component to perform the secure erase operation, the voltage pulse being applied in a program operation to increase a threshold voltage of a memory cell of the memory component to another voltage level that exceeds each threshold voltage state of the memory cell, wherein each threshold voltage state represents a bit value stored at the memory cell.

9. The system of claim 8, wherein each memory cell of the at least one wordline is in an open state in response to the application of the voltage pulse to the at least one wordline during a subsequent read operation.

10. The system of claim 9, wherein the subsequent read operation is to retrieve data associated with a particular wordline of the memory component, and wherein a result of the subsequent read operation corresponds to a same value that is based on each memory cell of the at least one wordline being in the open state during the subsequent read operation.

11. The system of claim 8, wherein each memory cell of the at least one wordline is at a threshold voltage state that exceeds the determined voltage level in response to the application of the voltage pulse during the program operation.

12. The system of claim 8, wherein the processing device is further to:
   determine whether the voltage pulse has been applied to a particular wordline of the memory component in response to a prior secure erase operation; and
   in response to determining that the voltage pulse has not been applied to the particular wordline, select the particular wordline as the at least one wordline to which the voltage pulse is to be applied.

13. The system of claim 8, wherein the at least one wordline corresponds to one or more wordlines in each block of the memory component that is to be securely erased.

14. The system of claim 8, wherein the processing device is further to:
   determine whether the voltage pulse has been applied to a particular wordline of the memory component in response to a prior secure erase operation; and
   in response to determining that the voltage pulse has been applied to the particular wordline, select a different wordline as the at least one wordline to which the voltage pulse is to be applied.

15. A system comprising:
   a memory component; and
   a processing device, operatively coupled with the memory component, to:
   receive an indication to perform a secure erase operation for a memory sub-system;
   determine a plurality of blocks of the memory sub-system that store data;
   determine a voltage level that is applied to unselected word lines of a block of the plurality of blocks for a read operation of the block by the memory sub-system; and
   in response to receiving the indication to perform the secure erase operation for the memory sub-system, perform a program operation to apply a voltage pulse to at least one wordline of each block of the plurality of blocks that store data, the voltage pulse increasing a threshold voltage of a memory cell of the memory component to another voltage level that is higher than each threshold voltage state of a memory cell of the memory component, wherein each threshold voltage state represents a bit value stored at the memory cell.

16. The system of claim 15, wherein each memory cell of the at least one wordline of each block is in an open state in response to the applying of the voltage pulse to the at least one wordline during a subsequent read operation.

17. The system of claim 16, wherein the subsequent read operation is to retrieve the data stored at the plurality of blocks, and wherein a result of the subsequent read operation corresponds to a same value that is based on each memory cell of the at least one wordline being in the open state during the subsequent read operation.

18. The system of claim 15, wherein each memory cell of the at least one wordline of each block is at a threshold voltage state that exceeds the determined voltage level in response to the application of the voltage pulse.

19. The system of claim 15, wherein the processing device is further to:
   determine whether the voltage pulse has been applied to a particular wordline of the memory component of a particular block in response to a prior secure erase operation; and
   in response to determining that the voltage pulse has been applied to the particular wordline, select the particular wordline for the particular block as the at least one wordline of the particular block for which the voltage pulse is to be applied.

20. The system of claim 15, wherein the processing device is further to:
- determine whether the voltage pulse has been applied to a particular wordline of the memory component of a particular block in response to a prior secure erase operation; and
- in response to determining that the voltage pulse has not been applied to the particular wordline, select the particular wordline for the particular block as the at least one wordline of the particular block for which the voltage pulse is to be applied.

* * * * *